United States Patent [19]

Ferla et al.

[11] Patent Number: 5,631,483

[45] Date of Patent: May 20, 1997

[54] POWER DEVICE INTEGRATED STRUCTURE WITH LOW SATURATION VOLTAGE

[75] Inventors: Giuseppe Ferla, Catania; Ferruccio Frisina, Sant'Agata li Battiati, both of Italy

[73] Assignee: SGS-Thomson Microelectronics S.r.l., Agrate Brianza, Italy

[21] Appl. No.: 509,881

[22] Filed: Aug. 1, 1995

[30] Foreign Application Priority Data

Aug. 2, 1994 [EP] European Pat. Off. ............ 94830393

[51] Int. Cl.$^6$ ................................................. H01L 29/76
[52] U.S. Cl. .................... 257/341; 257/342; 257/378; 257/142; 257/655
[58] Field of Search ........................ 257/341, 342, 257/378, 142, 655

[56] References Cited

U.S. PATENT DOCUMENTS

| 4,001,860 | 1/1977 | Cauge et al. | 357/23 |
|---|---|---|---|
| 4,072,975 | 2/1978 | Ishitani | 357/23 |
| 4,233,615 | 11/1980 | Takemoto et al. | 357/22 |
| 4,344,081 | 8/1982 | Pao et al. | 357/43 |
| 4,543,596 | 9/1985 | Strack et al. | 357/23.4 |
| 4,620,211 | 10/1986 | Baliga et al. | 357/38 |
| 4,694,313 | 9/1987 | Beasom | 357/23.4 |
| 5,221,850 | 6/1993 | Sakurai | 257/173 |

FOREIGN PATENT DOCUMENTS

| 0581246 | 2/1994 | European Pat. Off. | H01L 29/72 |
|---|---|---|---|
| 2256316 | 12/1992 | United Kingdom | H01L 29/78 |

OTHER PUBLICATIONS

Patent Abstracts of Japan, vol. 12, No. 225 (E-626)(3072) Jun. 25, 1988 & JP-A-63 018 675 Toshiba Corp.

*Primary Examiner*—Mark V. Prenty

*Attorney, Agent, or Firm*—Wolf, Greenfield & Sacks, P.C.; James H. Morris

[57] ABSTRACT

A power device integrated structure includes a semiconductor substrate of a first conductivity type, a semiconductor layer of a second conductivity type superimposed over the substrate, a plurality of first doped regions of the first conductivity type formed in the semiconductor layer, and a respective plurality of second doped regions of the second conductivity type formed inside the first doped regions. The power device includes: a power MOSFET having a fisrt electrode region formed by the second doped regions and a second electrode region formed by the semiconductor layer; a first bipolar junction transistor having an emitter, a base and a collector respectively formed by the substrate, the semiconductor layer and the first doped regions; and a second bipolar junction transistor having an emitter, a base and a collector respectively formed by the second doped regions, the first doped regions and the semiconductor layer. The doping profiles of the semiconductor substrate, the semiconductor layer, the first doped regions and the second doped regions are such that the first and second bipolar junction transistors have respective first and second common base current gains sufficiently high to cause the bipolar junction transistors to be biased in the high injection region, so that carriers are injected from the substrate into the semiconductor layer and from the second doped regions, through the first doped regions, into the semiconductor layer to modulate the conductivity of the second electrode of the power MOSFET; the fast and second common base current gains summed are less than unity to prevent a parasitic thyristor from triggering on.

15 Claims, 2 Drawing Sheets

POWER DEVICE INTEGRATED STRUCTURE WITH LOW SATURATION VOLTAGE

BACKGROUND OF THE INVENTION

1. Field of the Invention

The present invention relates to a power device integrated structure with low saturation voltage.

2. Discussion of the Related Art

It is known that the higher the drain-source voltage a power MOSFET must withstand, the thicker the epitaxial drain layer wherein the power MOSFET elementary cells are formed must be. This layer is lightly doped, and has a resistivity of the order of 50 Ohm/cm; since for maximum voltage ratings of 1000–2000 V a 100 µm-thick layer must be provided, a significant resistance is introduced in series to the conductive channel, which contributes to increasing the power MOSFET on-state resistance Ron. The power MOSFET Ron is thus directly related to the power MOSFET breakdown voltage BV, so that the higher BV the higher Ron. This is disadvantageous since it causes significant voltage drops across the power device, and large power dissipations.

The Insulated Gate Bipolar Transistor (IGBT) has been introduced to overcome the limitations of the power MOSFET structure in the high-voltage (1000–2000 V) application field.

The fundamental idea that led to the IGBT is the introduction of conductivity modulation of the drain layer: to this purpose, the substrate of the chip is doped of with a conductivity type opposite to that of the drain layer, so as to obtain a PN junction. When the IGBT is turned on by applying a proper bias voltage to the gate electrode, carriers flow from the emitter electrode through the conductive channel, and drift through the drain layer (which for this reason is also called "drift layer"); the substrate-drift layer junction becomes forward biased, and carriers of the opposite sign are injected from the substrate into the drift layer, whose conductivity is thus enhanced.

The problem is that the IGBT structure has inherently associated a parasitic three-junction device (i.e. a thyristor). Considering, for example, an N-channel device, the parasitic thyristor is made up of an NPN transistor with emitter and base respectively formed by the source and body regions of the elementary cells, and a collector formed by the drift layer, and a PNP transistor with collector, base and emitter respectively represented by the body regions of the elementary cells, the drift layer and the substrate.

If the parasitic thyristor triggers on, a low-resistance path is established between the source regions and the substrate, the current flowing through the device theorically diverges, and the IGBT is destroyed. It is therefore extremely important to prevent the parasitic thyristor from triggering on.

To this purpose, the designers' efforts conventionally aim at preventing the parasitic NPN from entering conduction. One way to achieve such a result is by reducing as far as possible its common base current gain αn. The dopant concentration in the source regions and in the body regions of the elementary cells, which respectively form the emitter and the base of the parasitic NPN, is thus properly chosen so that the difference in said concentration does not exceed a given value. Another way to assure that the parasitic NPN does not enter conduction is to clamp its base-emitter voltage to zero: the body regions are thus short-circuited by the emitter metal layer to the source regions. Also, to reduce the base-emitter resistance Rbe of such transistor, i.e. the physical resistance along the body region of the elementary cells, the body regions are provided with a heavily doped portion, and the length of the source regions is controlled so that they are almost completely internal to the heavily doped portion of the body regions.

The equivalent electrical circuit of the structure thus obtained includes a power MOSFET and a PNP transistor (the MOSFET's drain and source being connected to the PNP's base and collector, respectively), since the NPN transistor is substantially eliminated.

In this way, however, conductivity modulation of the drift layer can only take place from the substrate. Since the average lifetime, and consequently the diffusion length, of holes in the drift layer is low (to increase the IGBT speed performances the lifetime of holes in the drift layer is deliberately lowered by the introduction of lifetime killers, and a heavily doped "buffer" layer is provided at the bottom of the drift layer to facilitate the collection of holes when the IGBT is switched off), the conductivity modulation effect is quite limited, and the output resistance is high. In these conditions, it can be shown that the collector-emitter voltage in saturation (VCEsat) is proportional to the square of the drift layer thickness, and is therefore quite high. This causes static losses in the device.

In view of the state of the art described, it is an object of the present invention to provide a power device integrated structure in which the collector-emitter saturation voltage is lower than in conventional IGBT structures, so that static losses can be reduced.

SUMMARY OF THE INVENTION

According to the present invention, such object is attained by means of a power device integrated structure comprising a semiconductor substrate of a first conductivity type, a semiconductor layer of a second, opposite conductivity type superimposed over said substrate, a plurality of first doped regions of the first conductivity type formed in said semiconductor layer, and a respective plurality of second doped regions of the second conductivity type formed inside said first doped regions, the power device comprising:

a power MOSFET having a first electrode region formed by the second doped regions and a second electrode region formed by the semiconductor layer;

a first bipolar junction transistor having an emitter, a base and a collector respectively formed by the substrate, the semiconductor layer and the first doped regions; and a second bipolar junction transistor having an emitter, a base and a collector respectively formed by the second doped regions, the first doped regions and the semiconductor layer, wherein the doping profiles of the semiconductor substrate, the semiconductor layer, the first doped regions and the second doped regions are such that the first and second bipolar junction transistors have respective first and second common base current gains sufficiently high to cause said bipolar junction transistors to be biased in the high injection region, so that carriers are injected from the substrate into the semiconductor layer and from the second doped regions, through the first doped regions, into the semiconductor layer, respectively, to modulate the conductivity of the second electrode of the power MOSFET, the sum of the first and second common base current gains being less than unity to prevent a parasitic thyristor, formed by said first and second bipolar junction transistor, from triggering on.

As a result of the present invention, when the power MOSFET is turned on transistor action takes place both in the PNP and in the NPN parasitic transistors, even if the thyristor latching is prevented. The conductivity of the power MOSFET drain layer is thus modulated not only by the injection of (minority) carriers from the substrate, but also by (majority) carriers injected from the source regions into the body regions of the elementary cells, and collected by the drain layer. In this way, the conductivity modulation of the drain layer is much more effective, and the collector-emitter voltage in saturation (VCEsat) is lower, since it becomes proportional to ½ the square of the drift layer thickness.

The equivalent electrical circuit of the structure according to the present invention comprises a power MOSFET, and a PNP and an NPN transistor with base, and collector cross-connected to each other in a thyristor-like configuration. Both transistors become forward-biased when the power MOSFET is driven on, but the thyristor latching is prevented since $\alpha n + \alpha p < 1$.

BRIEF DESCRIPTION OF THE DRAWINGS

The features of the present invention will be made more evident by the following detailed description of a particular embodiment, illustrated as a non-limiting example in the annexed drawings, wherein:

FIG. 4 shows the flows of carriers when the power device is on; and

FIG. 5 is a diagram showing the profiles of the concentration of the injected carriers when the power device is on.

DETAILED DESCRIPTION

Figure 1:
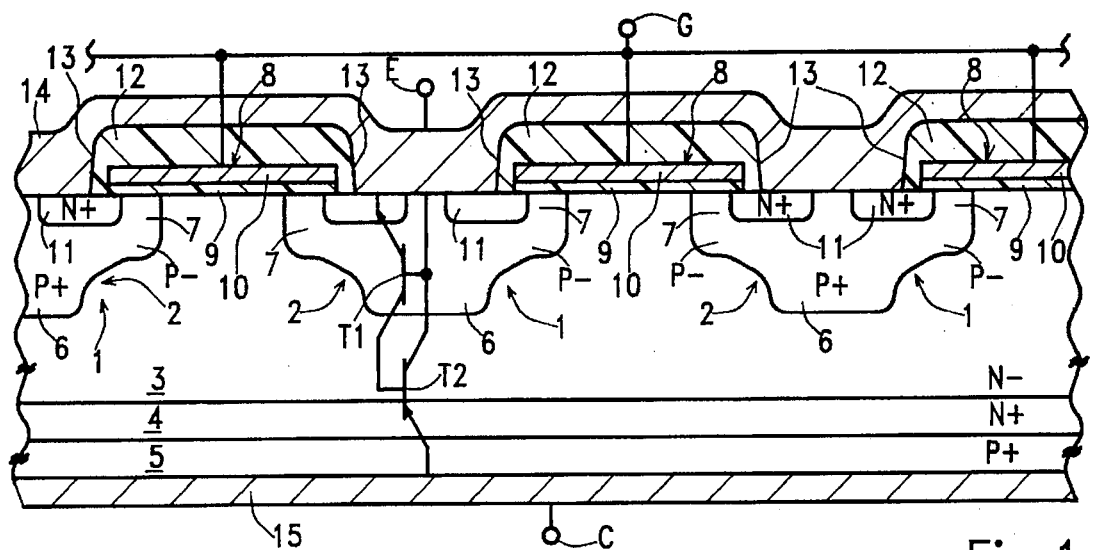
FIG. 1 is a cross-sectional view of a power device integrated structure according to the present invention.

A power device structure according to the present invention, example of the N channel type, is made up of a plurality of elementary functional units 1 comprising a P type body region 2, typically with polygonal plan, formed in a lightly doped N type semiconductor layer 3 called a "drift layer"; the N type layer 3 is superimposed over a heavily doped N type semiconductor layer 4 called a "buffer layer", which is in turn superimposed over a heavily doped P type substrate 5.

Each body region 2 comprises a central heavily doped portion 6 called "deep body region", and a lateral more lightly doped portion 7 called a "channel region".

Inside each body region 2 a heavily doped source N type region 11 is formed.

The surface of the N type layer 3 is covered by a conductive insulated gate layer 8 comprising a thin oxide layer 9 called a "gate oxide" and a conductive material layer 10 (generally of polysilicon) called a "gate layer". The insulated gate layer 8 layout forms a mesh structure. The gate layer 10 is connected to a gate electrode G of the power device.

An insulating material layer 12 covers the insulated gate layer 8; contact windows 13 are opened in the insulating material layer 12 over the elementary units 1 to allow a superimposed metal layer 14 to contact the source regions 11 and the deep body regions 6. The metal layer 14 forms an emitter electrode E of the power device. A metal layer 15 is also provided at the bottom surface of the substrate 5 to form a collector electrode C of the power device.

Figure 3:
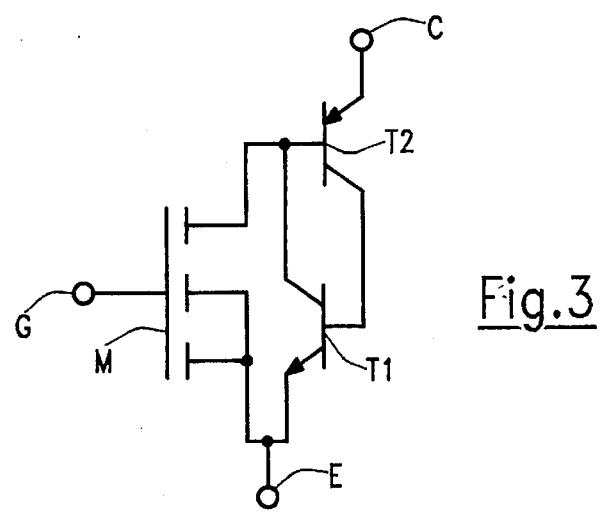
FIG. 3 is an electric equivalent circuit of the power device structure according to the present invention.

From the electrical point of view, the power device structure comprises: a power MOSFET M formed by the source regions 11, the channel regions 7 and the N type layer 3; an NPN bipolar junction transistor T1 formed by the source regions 11, the body regions 2 and the N type layer 3; and a PNP bipolar junction transistor T2 formed by the substrate 5, the N type layer 3 and the body regions 2. The two transistors T1 and T2 are cross-connected to form a three junction device, i.e. a thyristor (FIG. 3).

Figure 2:
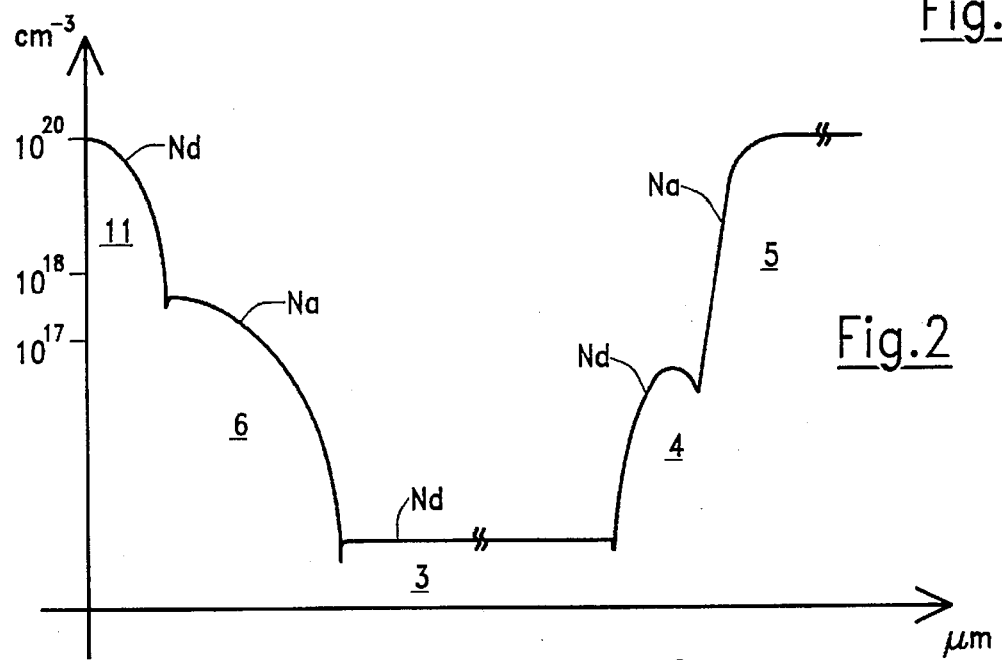
FIG. 2 is a diagram showing the doping profiles of the various semiconductor regions of the structure shown in FIG. 1.

The doping profiles Nd and Na of the various semiconductor regions, shown in FIG. 2, are such that both the NPN transistor T1 and the PNP transistor T2 have respective common base current gains $\alpha n$ and $\alpha p$ sufficiently high to cause transistor action to take place, the sum $\alpha n + \alpha p$ being, however, kept below unity to prevent the thyristor from triggering on. Preferably: said doping profiles are such that $\alpha n$ and $\alpha p$ are both a little lower than 0.5.

With respect to the known IGBT structures, wherein the doping profiles are such that the NPN transistor $\alpha n$ is almost zero, the source regions 11 are more heavily doped, to increase the emitter efficiency of T1: while in fact in conventional structures the peak dopant concentration of the source regions 11 is of the order of $10^{19}$ atoms/cm3, in the structure according to the present invention the source regions 11 have a peak dopant concentration at least one order of magnitude higher ($10^{20}$ atoms/cm3). Additionally, the deep body regions 6 are more lightly doped (in conventional structures, the doping profile of the deep body regions 6 is such that under the source regions 11 the dopant concentration is of the order of $10^{18}$–$10^{19}$ atoms/cm3).

In conventional structures the buffer layer 4 is provided to facilitate the collection of minority carriers present in the N type layer 3 when the power device is switched off. In fact, the buffer layer 4 limits the diffusion length of holes which modulate the conductivity of the the N type layer 3 (i.e. the PNP transistor $\alpha p$ is reduced). Consequently, in conventional structures there is a trade-off between the IGBT switching performance and its collector-emitter voltage in saturation: the peak dopant concentration of the buffer layer 4 is of the order of $10^{16}$ atoms/cm3. In the structure according to the present invention, since the conductivity of the N type layer 3 is not only modulated by holes injected into it from the substrate 5, but also by electrons injected into the collector of T1, such a trade-off does not exist. On the contrary, the doping level of the buffer layer 4 should be sufficiently high to reduce the PNP transistor emitter efficiency. The peak dopant concentration of the buffer layer 4 is thus increased to at least $10^{17}$–$10^{18}$ atoms/cm3, so that $\alpha p$ achieves the desired value of approximately 0.5. Thus, the power device according to the present invention not only has a lower collector-emitter saturation voltage, but is also intrinsically faster than conventional IGBTs.

Figure 4:
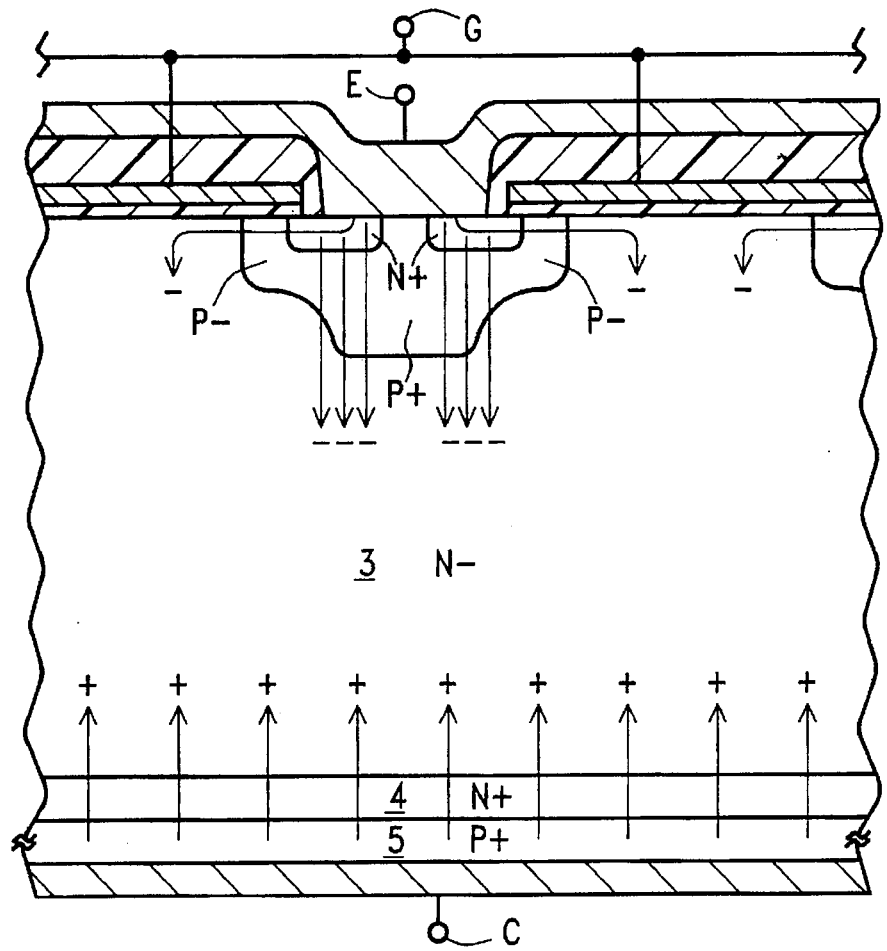
Figure 5:
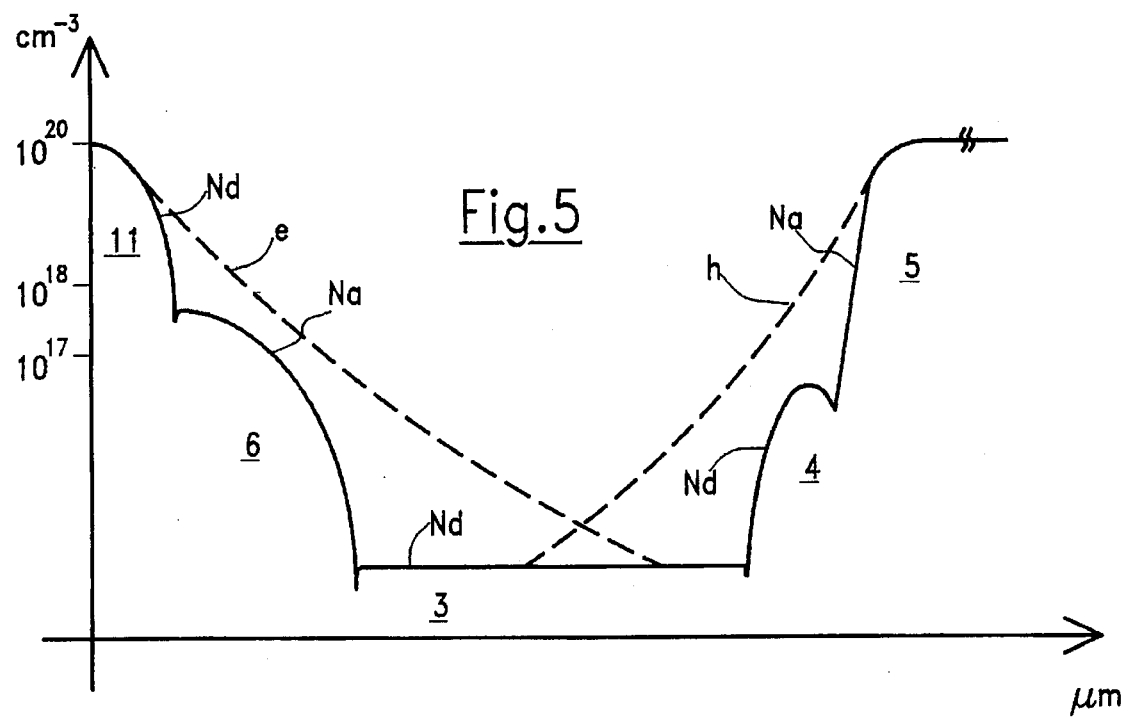

When a proper bias voltage is applied to the gate electrode G, an inversion channel is formed in the channel regions 7 of the elementary functional units 1, and the power device turns on. Electrons enter the power device from the emitter electrode E, flow along the inversion channel, and drift in the N type layer 3 to the substrate 5, where they are collected at the collector electrode C. The buffer layer 4-substrate 5 junction becomes forward biased, and T2 is turned on; the base current of T2 turns T1 on, so that electrons from the source regions 11 are vertically injected into the body regions 2 and are collected by the N type layer 3. The N type layer 3 is therefore modulated in conductivity both from the bottom (by holes injected from the substrate 5) and from the top (by electrons flowing from the emitter to the collector of T1) (FIG. 4). The concentration profiles of the conductivity-modulating electrons and holes in the N type layer are shown in FIG. 5 (e and h, respectively).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power device integrated structure comprising a semiconductor substrate of a first conductivity type, a semiconductor layer of a second, opposite conductivity type superimposed over said substrate, a plurality of first doped regions of the first conductivity type formed in said semiconductor layer, and a respective plurality of second doped regions of the second conductivity type formed inside said first doped regions, the power device comprising:

a power MOSFET having a first electrode region formed by the second doped regions and a second electrode region formed by the semiconductor layer;

a first bipolar junction transistor having an emitter, a base and a collector respectively formed by the substrate, the semiconductor layer and the first doped regions; and a second bipolar junction transistor having an emitter, a base and a collector respectively formed by the second doped regions, the first doped regions and the semiconductor layer, wherein the doping profiles of the semiconductor substrate, the semiconductor layer, the first doped regions and the second doped regions are such that the first and second bipolar junction transistors have respective first and second common base current gains sufficiently high to cause said bipolar junction transistors to be biased in the high injection region, so that carriers are injected from the substrate into the semiconductor layer and from the second doped regions, through the first doped regions, into the semiconductor layer, respectively, to modulate the conductivity of the second electrode of the power MOSFET, the sum of the common base current gains of the first and second bipolar junction transistors being less than unity to prevent a parasitic thyristor, formed by said first and second bipolar junction transistors, from triggering on.

2. The power device integrated structure according to claim 1, wherein the semiconductor layer comprises a lightly doped portion and a heavily doped portion directly over the substrate, the difference in dopant concentration between the substrate and the heavily doped portion of the semiconductor layer being equal to or lower than three orders of magnitude.

3. The power device integrated structure according to claim 2, wherein the substrate has a dopant concentration of the order of $10^{20}$ atoms/cm$^3$, and the heavily doped portion of the semiconductor layer has a dopant concentration of approximately $10^{17}$ atoms/cm$^3$.

4. The power device integrated structure according to claim 1, wherein the difference in dopant concentration between the second doped regions and the first doped regions is about two orders of magnitude.

5. The power device integrated structure according to claim 4, wherein the second doped regions have a dopant concentration of approximately $10^{20}$ atoms/cm$^3$.

6. The power device integrated structure according to claim 1, wherein the first conductivity type is P type, and the second conductivity type is N type.

7. The power device integrated structure according to claim 1, wherein the first conductivity type is N type, and the second conductivity type is P type.

8. An integrated power device comprising:

a semiconductor substrate of a first conductivity type;

a semiconductor layer of a second conductivity type superimposed over said substrate;

a plurality of first doped regions of the first conductivity type formed in said semiconductor layer;

a plurality of second doped regions of the second conductivity type, each one of the plurality of second doped regions of the second conductivity type being formed inside a corresponding one of the plurality of first doped regions;

wherein a power MOSFET is formed in the integrated power device having a first electrode region formed by the plurality of second doped regions, and a second electrode region formed by the semiconductor layer, the MOSFET having an on state in which a conductive path is formed between its first and second electrode regions;

wherein a first bipolar junction transistor is formed in the integrated power device having an emitter, a base and a collector respectively formed by the plurality of second doped regions, the plurality of first doped regions and the semiconductor layer;

wherein a second bipolar junction transistor is formed in the integrated power device having an emitter, a base and a collector respectively formed by the plurality of second doped regions, the plurality of first doped regions and the semiconductor layer, the first and second bipolar junction transistors forming a parasitic thyristor in the integrated power device; and means for biasing the first and second bipolar junction transistors in a high injection region during the on state of the MOSFET device, so that carriers are injected from the substrate and from the second doped regions into the semiconductor layer to modulate the conductivity of the second electrode of the power MOSFET, the means for biasing including means for preventing the parasitic thyristor from triggering on.

9. The integrated power device of claim 8, wherein each of the first bipolar transistor and the second bipolar transistor has a common base current gain, and wherein the sum of the common base current gain of the first bipolar transistor and the common base current gain of the second bipolar transistor is less than one.

10. The integrated power device of claim 9, wherein the semiconductor layer comprises a lightly doped portion and a heavily doped portion directly over the substrata, and wherein a ratio of dopant concentration of the substrate to dopant concentration of the heavily doped portion of the semiconductor layer is approximately 1000.

11. The integrated power device of claim 10, wherein dopant concentration of the substrate is approximately $10^{20}$ atoms/cm$^3$, and dopant concentration of the heavily doped portion of the semiconductor layer is approximately $10^{17}$ atoms/cm$^3$.

12. The integrated power device of claim 8, wherein the semiconductor layer comprises a lightly doped portion and a heavily doped portion directly over the substrate, and wherein a ratio of dopant concentration of the substrate to dopant concentration of the heavily doped portion of the semiconductor layer is approximately 100.

13. The integrated power device of claim 8, wherein the semiconductor layer includes a lightly doped portion and a heavily doped portion directly over the substrate, and wherein a ratio of dopant concentration of the substrate to dopant concentration of the heavily doped portion of the semiconductor layer is approximately 1000.

14. A method of providing conductivity modulation to a drain layer of an insulated gate bipolar transistor, wherein a power MOSFET having a gate and first and second electrode regions, and a parasitic thyristor including first and second bipolar junction transistors are formed in the insulated gate bipolar transistor, the method including steps of:

applying a voltage to the gate of the power MOSFET to activate an on state of the power MOSFET;

biasing the first and second bipolar junction transistors in a high injection region during the on state of the MOSFET device, so that carriers are injected through each of the first and the second bipolar transistors to modulate the conductivity of the second electrode region of the power MOSFET; and preventing the parasitic thyristor from triggering on while the MOSFET is in the on state.

15. The method of claim 14, wherein each of the first bipolar junction transistor and the second bipolar junction transistor has a common base current gain, and wherein the method further comprises a step of:

maintaining the sum of the common base current gain of the first bipolar junction transistor and the common base current gain of the second bipolar junction transistor to be less than one.

* * * * *

UNITED STATES PATENT AND TRADEMARK OFFICE
CERTIFICATE OF CORRECTION

PATENT NO. : 5,631,483
DATED : May 20, 1997
INVENTOR(S) : Giuseppe Ferla, et. al.

It is certified that error appears in the above-indentified patent and that said Letters Patent is hereby corrected as shown below:

Assignee:
On the title page, item [73] should read:

[73] SGS-Thomson Microelectronics S.r.l. Agrate Brianza, and Consorzio per la Ricerca sulla Microelettronica nel Mezzogiorno, Catania, both of Italy Signed and Sealed this Thirtieth Day of June, 1998

*Attest:*

*Attesting Officer*

BRUCE LEHMAN

*Commissioner of Patents and Trademarks*